(12) United States Patent
Ditewig et al.

(10) Patent No.: US 7,206,220 B2
(45) Date of Patent: Apr. 17, 2007

(54) MRAM-CELL AND ARRAY-ARCHITECTURE WITH MAXIMUM READ-OUT SIGNAL AND REDUCED ELECTROMAGNETIC INTERFERENCE

(75) Inventors: Anthonie Meindert Herman Ditewig, Eindhoven (NL); Roger Cuppens, Eindhoven (NL)

(73) Assignee: NXP, B.V., Eindhoven (NL)

( * ) Notice: Subject to any disclaimer, the term of this patent is extended or adjusted under 35 U.S.C. 154(b) by 177 days.

(21) Appl. No.: 10/515,475

(22) PCT Filed: May 19, 2003

(86) PCT No.: PCT/IB03/02231

§ 371 (c)(1),
(2), (4) Date: Nov. 19, 2004

(87) PCT Pub. No.: WO03/098637

PCT Pub. Date: Nov. 27, 2003

(65) Prior Publication Data

US 2006/0056223 A1 Mar. 16, 2006

(30) Foreign Application Priority Data

May 22, 2002 (EP) .................................. 02076999

(51) Int. Cl.
*G11C 11/00* (2006.01)

(52) U.S. Cl. ...................................... 365/158; 365/171
(58) Field of Classification Search ................ 365/158, 365/171, 173
See application file for complete search history.

(56) References Cited

U.S. PATENT DOCUMENTS

| | | | |
|---|---|---|---|
| 5,541,868 A | 7/1996 | Prinz | |
| 5,699,293 A | 12/1997 | Chen et al. | |
| 6,215,707 B1 * | 4/2001 | Moyer | 365/189.07 |
| 6,335,890 B1 * | 1/2002 | Reohr et al. | 365/225.5 |
| 6,498,747 B1 * | 12/2002 | Gogl et al. | 365/158 |
| 2001/0043488 A1 | 11/2001 | Plasa et al. | |

FOREIGN PATENT DOCUMENTS

EP 1 109 170 6/2001

* cited by examiner

Primary Examiner—Vu A. Le
(74) Attorney, Agent, or Firm—Peter Zawilski

(57) ABSTRACT

An MRAM memory is proposed which gives a maximum read-out signal. This is advantageous for high-speed sensing of the MRAM bits. In an MRAM memory with magnetoresistive memory cells linked together to form logically organized rows and columns, It is obtained by, at least during writing, connecting write bitlines of two adjacent rows or columns with each other, so as to write inverse data values in two adjacent memory cells. In this way, a return path for the writing current is provided in a small loop, which enhances EMC behavior.

19 Claims, 8 Drawing Sheets

MRAM-CELL AND ARRAY-ARCHITECTURE WITH MAXIMUM READ-OUT SIGNAL AND REDUCED ELECTROMAGNETIC INTERFERENCE

The present invention relates to a matrix with magnetoresistive memory cells and to non-volatile magnetic memories, more particularly to magnetoresistive random access memories (MRAMs), comprising such a matrix and methods of operating and making the same.

Magnetic or Magnetoresistive Random Access Memory (MRAM) is currently being considered by many companies as a successor to flash memory. It has the potential to replace all but the fastest static RAM (SRAM) memories. It is a non-volatile memory (NVM) device, which means that no power is required to sustain the stored information. This is seen as an advantage over most other types of memory.

Non-volatile memories are used in a wide variety of commercial and military electronic devices and equipment, such as e.g. hand-held telephones, radios and digital cameras. The market for these electronic devices continues to demand devices with a lower voltage, lower power consumption and a decreased chip size.

The MRAM concept was originally developed at Honeywell Corp. USA, and uses magnetization direction in a magnetic multilayer device as information storage and the resultant resistance difference for information readout. As with all memory devices, each cell in an MRAM array must be able to store at least two states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR or Magnetic Tunnel Junction (MTJ) or Spin Dependent Tunneling (SDT) effect provide possibilities to realize a.o. non-volatile magnetic memories. These devices comprise a stack of thin films of which at least two are ferromagnetic or ferrimagnetic, and which are separated by a non-magnetic interlayer. GMR is the magneto-resistance for structures with conductor interlayers and TMR is the magneto-resistance for structures with dielectric interlayers. If a very thin conductor is placed between two ferromagnetic or ferrimagnetic films, then the effective in-plane resistance of the composite multilayer structure is smallest when the magnetization directions of the films are parallel and largest when the magnetization directions of the films are anti-parallel. If a thin dielectric interlayer is placed between two ferromagnetic or ferrimagnetic films, tunneling current between the films is observed to be the largest (or thus resistance to be the smallest) when the magnetization directions of the films are parallel and tunneling current between the films is the smallest (or thus resistance the largest) when the magnetization directions of the films are anti-parallel.

Magneto-resistance is usually measured as the percentage increase in resistance of the above structures going from parallel to anti-parallel magnetization states. TMR devices provide higher percentage magneto-resistance than GMR structures, and thus have the potential for higher signals and higher speed. Recent results indicate tunneling giving over 40% magneto-resistance, compared to 6–9% magneto-resistance in good GMR cells.

A magnetic tunnel junction magnetoresistive random access memory (MTJ MRAM) comprises a plurality of magnetoresistive memory cells 1 arranged in rows and columns of an array. One such prior art memory cell 1 is shown in FIG. 1. Each memory cell 1 comprises a magnetoresistive memory element 2, a first intersection of a digitline 4 and a bitline 6, and a second intersection of the bitline 6 and a wordline 8. The memory cells 1 are coupled in series in columns by means of the bitlines 6 and coupled in series in rows by means of the digitlines 4 and wordlines 8, thus forming the array. The magnetoresistive memory elements 2 used are magnetic tunnel junctions (MTJs).

MTJ memory elements 2 generally include a non-magnetic conductor forming a lower electrical contact, a pinned magnetic layer, a dielectric barrier layer positioned on the pinned layer, and a free magnetic layer positioned on the dielectric barrier layer, with an upper contact on the free magnetic layer. The pinned magnetic layer and the free magnetic layer may both be composed of e.g. NiFe, and the dielectric barrier layer may e.g. be made of AlOx.

The pinned layer of magnetic material has a magnetic vector that always points in the same direction. The magnetic vector of the free layer is free, but constrained by the physical size of the layer, to point in either of two directions: parallel or anti-parallel with the magnetization direction of the pinned layer.

An MTJ memory element 2 is used by connecting it in a circuit such that electricity can flow vertically through the element 2 from one of the magnetic layers to the other. The MTJ cell 1 can be electrically represented by a resistor R in series with a switching element such as a transistor T, as shown in FIG. 1. The size of the resistance of the resistor R depends on the orientation of the magnetic vectors of the free and pinned magnetic layers of the memory element 2. The MTJ element 2 has a relatively high resistance (HiRes) when the magnetic vectors point in opposite directions, and it has a relatively low resistance (LoRes) when the magnetic vectors point in the same direction.

Cross-section and top views of an MTJ cell 1 according to the prior art are shown in FIG. 2, and a diagrammatic elevational view of a 2×2 array of prior art cells is shown in FIG. 3. In an MRAM array, comprising a plurality of MRAM cells, orthogonal conductive lines 4, 6 pass under and over each bit or memory element 2, carrying current that produces the switching field. Each bit is designed so that it will not switch when current is applied to just one line, but will switch when current is flowing through both lines that cross at the selected bit (switching will occur only if the magnetic vector of the free layer is not in accordance with the direction of the switching field).

Digitlines 4 and bitlines 6 are provided in an array of MTJ memory cells 1, where the digitlines 4 travel along the rows of the array on one side of the memory elements 2, and the bitlines 6 travel down the columns of the array on the opposite side of the memory elements 2. The structure in FIG. 3 is partially turned inverted for clarity purposes: digit lines 4 physically run underneath the MTJ elements 2 (at that side of the MTJ elements 2 oriented towards the substrate in which the transistor T is provided), and bitlines 6 physically run over the MTJ elements 2 (at that side of the MTJ elements 2 oriented away from the substrate in which the transistor T is provided). However, if drawn that way, the bitlines 6 would obscure the magnetoresistive elements, which are the more relevant parts of the drawing.

Each memory element 2 is a layered structure comprising a fixed or pinned layer 10, a free layer 12 and a dielectric barrier 14 in between. By applying a small voltage over the sandwich of ferromagnetic or ferrimagnetic layers 10, 12 with the dielectric 14 therebetween, electrons can tunnel through the dielectric barrier 14.

The memory element 2 is connected to the transistor T by means of an interconnect layer 16 and a plurality of metallization layers 18 and vias 20. There is a galvanic connection 22 between the memory element 2 and the bitline 6. The transistor T of each memory cell 1 is connected to a ground line 24.

In write or program mode, represented in FIG. 4, required currents flow through selected digitlines 4 and bitlines 6 so that at their intersection a peak magnetic field is generated, sufficient to switch the polarization of the free layer 12 of the MTJ element 2, so as to switch the resistance of the MTJ cell 2 from the LoRes (low resistance) state to the HiRes (high resistance) state or vice versa (depending on the direction of the current through the bitline 6). At the same time, the transistor T in the selected memory cell 1 is in the cut-off state by keeping the voltage on the wordline 8 low (0 volt). For example in the embodiment represented in FIG. 4, the left cell is selected to be programmed. The current through the left bitline 6 is common for both the left cell and all other cells on that column. Current flows through the digitline 4 of the left cell and all other cells on the same row, but not through the digitline 4 of the cells at the right. The currents in the digitline 4 and bitline 6 are such that together they provide a magnetic field able to change the direction of the magnetic vector of the free layer of the foreground left hand cell, but the current in either strip by itself is not able to change the storage state. Therefore only the selected memory cell (the left one in the example given) is written.

The information stored in a selected memory cell 1 (the left cell in the example of FIG. 5) may be read. As an example, the HiRes state of a memory cell can e.g. be 13 kΩ, and the LoRes state 10 kΩ. If the read voltage on a read bitline is 0.3 Volt, the current through memory element 2 of cell will be 23 μA or 30 μA respectively. In prior art devices, a sense amplifier is adjusted to e.g. a current detection point at an intermediate value, e.g. 26.5 μA. If the current detected through that sense amplifier is higher than 26.5 μA, the sense amplifier concludes that the MTJ element 2 is in the LoRes state. If the current through MTJ element 2 is lower than 26.5 μA, the sense amplifier concludes that the MTJ element 2 is in the HiRes state. However, as the current differences between HiRes and LoRes state are not very big (only 7 μA in the example given), this is not a very reliable and fast way of sensing.

According to another prior art read method, the resistance of a cell to be read is compared with the resistance of a reference memory cell located along a same wordline 8. Reference cells are present every x columns, where x is usually 32, 64 or 128 but it can be any number. The MTJ elements in reference memory cells are not programmed, and their resistance value always remains at, for example, the minimum level (LoRes). A reference cell is read together with a selected cell. A memory cell 1 is selected for being read by driving the wordline 8 of that cell to VDD and in that way selecting a row and turning on all transistors. Current is sent through the bitline 6 of the column in which the selected cell is located. Since, of the memory cells in that column, only the transistor associated with a selected MTJ cell 1 is activated, current can only flow from the selected bitline 6 to the groundline 24 through the selected cell 1. During a read operation, the current through the read MTJ element is compared with the current through the reference MTJ. If those currents are the same, the sense amplifier concludes that the read MTJ is in the LoRes state. When the current through the read MTJ is lower than the current through the reference MTJ, the sense amplifier concludes that the read MTJ is in the HiRes state. It can be seen that if both the read MTJ and the reference MTJ are in the same, e.g. LoRes, state, there will, in principle, be no current difference measured. In practice, however, the current will never be 100% exactly the same, because MTJs which are both in the LoRes state will not have 100% the same resistive value due to process tolerances and so on, which makes it difficult and slow to read out prior art memory cells.

Generally, during a readout operation of the whole or a part of the memory array, a first bitline 6 will be activated, and the wordlines 8 will then be sampled sequentially, i.e. for each cell of each row. The result of the comparison of the current through the read MRAM cell and the current through the reference memory cell can be different (in the case the read-NRAM cell is in the HiRes state) or the same (in the case the read-MRAM cell is in the LoRes state). This means that not always the maximum readout signal is available which limits the speed of the read-operation.

In TMR devices, a sense current has to be applied perpendicular to the layer planes (CPP—current perpendicular to plane) because the electrons have to tunnel through the barrier layer.

It is a disadvantage that the difference in resistance value (the MR-ratio) is maximally 50% at this moment. This is enough for readout but it is not enough to compete with the ultra-highspeed SRAM-caches.

It is a disadvantage that the large currents needed to write a bit in a prior art MRAM cell generate serious electromagnetic interference (EMI) problems.

It is an object of the present invention to overcome the disadvantages of the prior art MRAM memories.

It is an object of the present invention to provide MRAM memories with a maximum readout signal. It is a further object of the present invention to provide fast MRAM memories and methods of making the same.

It is yet another object of the present invention to decrease EMI problems in memories having magnetoresistive memory elements as well as methods of making such memories.

The above objectives are accomplished by the devices and methods of the present invention.

The present invention provides a matrix with magnetoresistive memory cells, each magnetoresistive memory cell comprising a magnetoresistive memory element and the magnetoresistive memory cells being linked together to form logically organized rows and columns. There is at least a first row or column adjacent to a second row or column. The first row or column has at least a first row or column write line and the second row or column has at least a second row or column write line. The matrix comprises connecting means between said first and second row or column write lines, for at least temporarily electrically connecting said first and second row or column write lines to each other, so that a current flowing in the first row or column write line flows in the opposite direction to the same current flowing in the second row or column write line. Each of the first and second adjacent rows or columns may have a row or column read line.

The row or column read lines and the row or column write lines for a same row or column, respectively, may be separate lines, in which case the connecting means may comprise a fixed electrical connection between the first and second row or column write lines, or they may be physically the same lines, in which case the connecting means may comprise a first switching element.

The first and second column or row write lines may be continuous conductive strips which are magnetically couplable to the magnetoresistive elements of each of the memory cells of the respective column or row. The column or row read lines may be continuous conductive strips which are electrically couplable to an electrode of the magnetoresistive memory elements of the magnetoresistive memory cells of a column or row, respectively.

Each row or column may furthermore have a digitline, the digitline being a continuous conductive strip which is magnetically couplable to the magnetoresistive memory element of each of the magnetoresistive memory cells of a row or column.

Each row or column may furthermore have a wordline and each magnetoresistive memory cell may comprises a second switching element for connecting another electrode of the magnetoresistive memory element to a voltage source, the wordline being a continuous strip electrically connected to each of the second switching elements of a row or column.

The magnetoresistive memory elements may be based on the TMR effect.

A matrix according to the present invention may be used as an MRAM memory.

The present invention furthermore provides an MRAM memory comprising a matrix and selecting circuitry for selecting a cell to be read and/or a cell to be written. The matrix has magnetoresistive memory cells, each magnetoresistive memory cell comprising a magnetoresistive memory element, and the magnetoresistive memory cells being linked together to form logically organized rows and columns. There is at least a first row or column adjacent to a second row or column. The first row or column has at least a first row or column write line and the second row or column has at least a second row or column write line. The matrix comprises connecting means between said first and second row or column write lines, for at least temporarily electrically connecting said first and second row or column write lines to each other, so that a current flowing in the first row or column write line flows in the opposite direction to the same current flowing in the second row or column write line.

Each of the first and second adjacent rows or columns of the MRAM memory may have a row or column read line.

The row or column read lines and the row or column write lines for a same row or column, respectively, of the MRAM memory may be separate lines or they may physically be the same lines. In the first case the connecting means may comprise a fixed electrical connection between the first and second row or column write lines. In the second case, the connecting means may comprise a first switching element.

The first and second column or row write lines of the MRAM memory may be continuous conductive strips which are magnetically couplable to the magnetoresistive elements of each of the memory cells of the respective column or row. The column or row read lines of the MRAM memory may be continuous conductive strips which are electrically couplable to an electrode of the magnetoresistive memory elements of the magnetoresistive memory cells of a column or row, respectively.

Each row or column of the MRAM memory may have a digitline, the digitline being a continuous conductive strip which is magnetically couplable to the magnetoresistive memory element of each of the magnetoresistive memory cells of a row or column. Each row or column of the MRAM memory may have a wordline and each magnetoresistive memory cell may comprise a second switching element for connecting another electrode of the magnetoresistive memory element to a voltage source, the wordline being a continuous strip electrically connected to each of the second switching elements of a row or column.

The selecting circuitry of the MRAM memory may comprise a row select decoder and/or a column select decoder.

A row current source may be connected to the row select decoder for providing a selected digitline with electrical energy. A write bitline current source may be connected to the column select decoder for providing a selected write line with electrical energy.

The selecting circuitry of the MRAM memory may be adapted to provide simultaneous reading of one cell in a column and writing to another cell in the same column or simultaneous reading from one cell in a row and writing to another cell in the same row.

The MRAM memory may furthermore comprise sense amplifiers connectable to the column read lines.

The present invention also provides a method of operating a matrix with magnetoresistive memory cells having a first and second state and linked together to form logical columns and rows. The method includes a step of simultaneously writing a first state into a memory cell of a first row or column and writing a second state into an adjacent memory cell of an adjacent row or column. Each state may relate to a resistance value of a magnetoresistive memory cell. The method then further comprises a step of simultaneously reading out two adjacent memory cells of two adjacent rows or columns for obtaining resistance values of two adjacent memory cells, and comparing said resistance values for obtaining memory content.

The method may further comprise a step of reducing electromagnetic interference by sending current through a column or row write line and through a return path lying in the same plane as the column or row write line and adjacent to the column or row write line.

The method may further comprise simultaneously reading from one cell in a column and writing to another cell in the same column or simultaneously reading from one cell in a row and writing of another cell in the same row.

The present invention also provides a method of making an MRAM memory. The method comprises the steps of forming a plurality of magnetoresistive memory elements logically arranged in rows and columns, forming at least a first and a second row or column write line to be magnetically couplable to the magnetoresistive memory elements of first and second adjacent rows or columns, respectively, and forming connecting means between said first and second row or column write lines for at least temporarily electrically connecting said first and second row or column write lines to each other. The step of forming the connecting means may comprise forming a fixed electrical connection or forming a switch element.

Other features and advantages of the present invention will become apparent from the following detailed description, taken in conjunction with the accompanying drawings, which illustrate, by way of example, the principles of the invention.

In the different figures, the same reference numbers refer to the same or analogous elements.

The present invention will be described with respect to particular embodiments and with reference to certain drawings but the invention is not limited thereto but only by the claims. The drawings described are only schematic and are non-limiting. Where the term "comprising" is used in the present description and claims, is does not exclude other elements or steps. Where an indefinite or definite article when referring to a singular noun is used e.g. "a" or "an", "the", this includes a plural of that noun unless something else this is specifically stated.

Throughout this description, the terms "column" and "row" are used to describe sets of array elements which are linked together. The linking can be in the form of a Cartesian array of rows and columns however the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, the claims refer to logically organized rows and columns. By this is meant that sets of memory elements are linked together in a topologically linear intersecting manner however, that the physical or topographical arrangement need not be so. For example, the rows may be circles and the columns radii of these circles and the circles and radii are described in this invention as "logically organized" rows and columns. Also, specific names of the various lines, e.g. bitline, wordline or digitline are intended to be generic names used to facilitate the explanation and to refer to a particular function, and this specific choice of words is not intended to in any way limit the invention. It should be understood that all these terms are used only to facilitate a better understanding of the specific structure being described, and are in no way intended to limit the invention.

According to a first embodiment of the present invention, a matrix is provided with magnetoresistive memory cells linked together to form logically organized rows and columns. A memory will be described with physical rows and columns as an example. Each magnetoresistive memory cell comprises a magnetoresistive memory element and a switching element such as a transistor for example.

Figure 1:
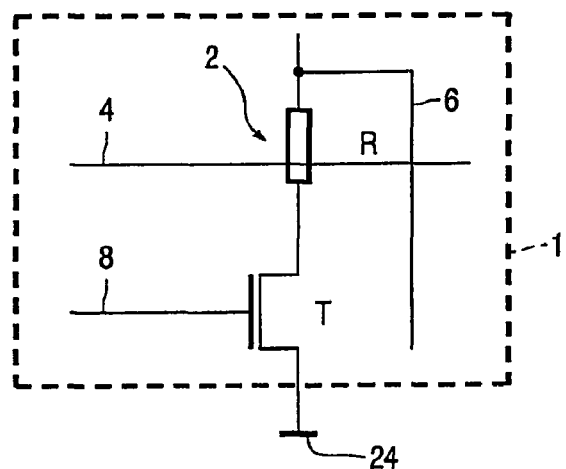
FIG. 1 is an electrical representation of an MTJ cell for connection in an array according to the prior art.
Figure 2:
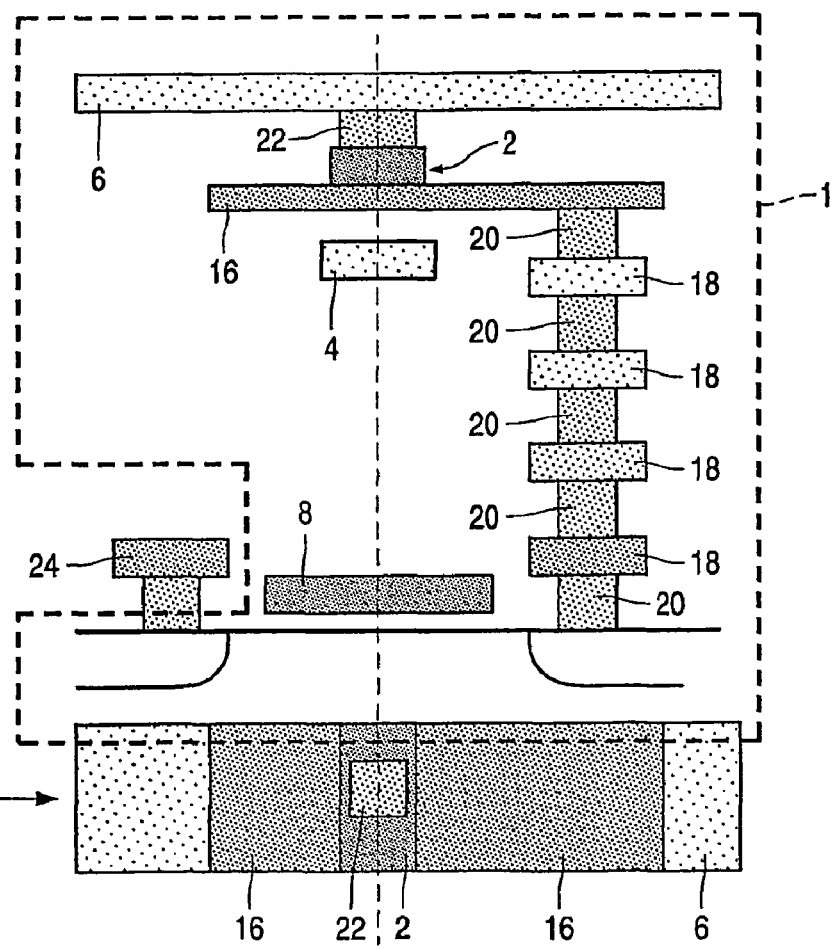
FIG. 2 shows a cross-section and a schematic top view of an MTJ cell according to the prior art, with line 6 partly removed.
Figure 3:
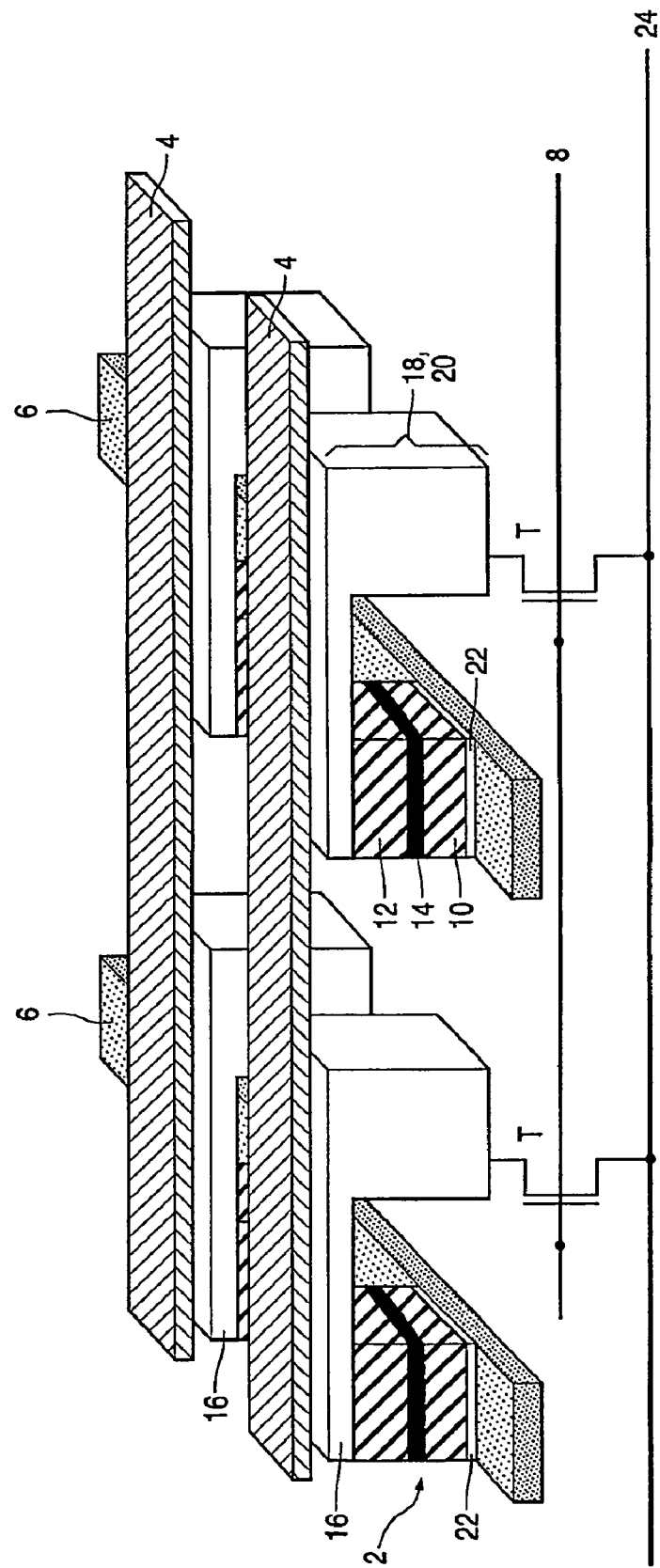
FIG. 3 is a diagrammatic elevational view of a 2×2 array of MTJ cells according to the prior art.
Figure 4:
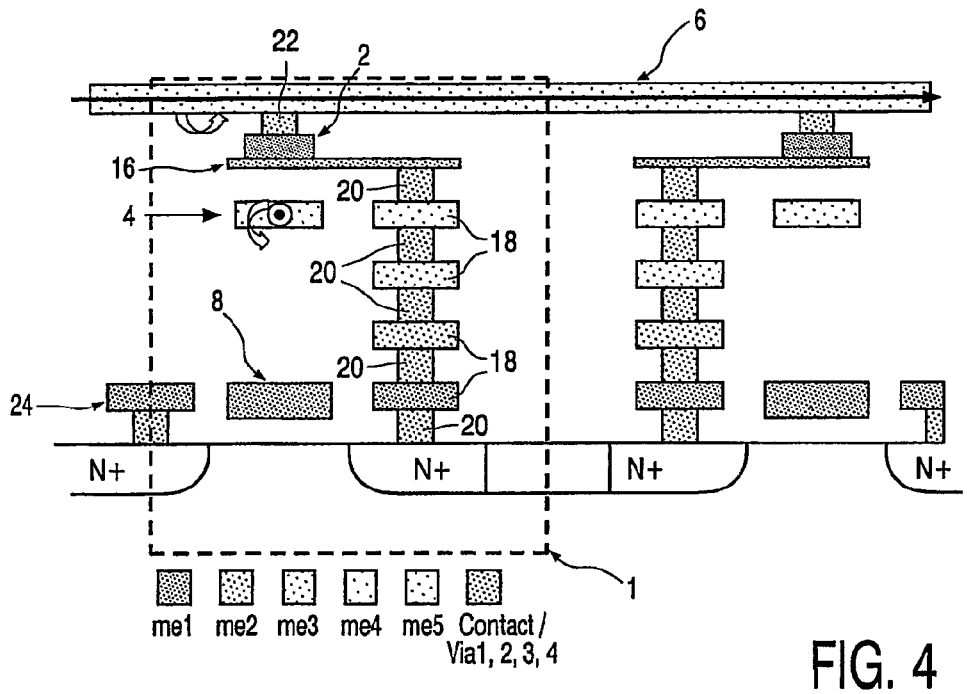
FIG. 4 illustrates the conventional process of programming an MTJ memory cell.
Figure 5:
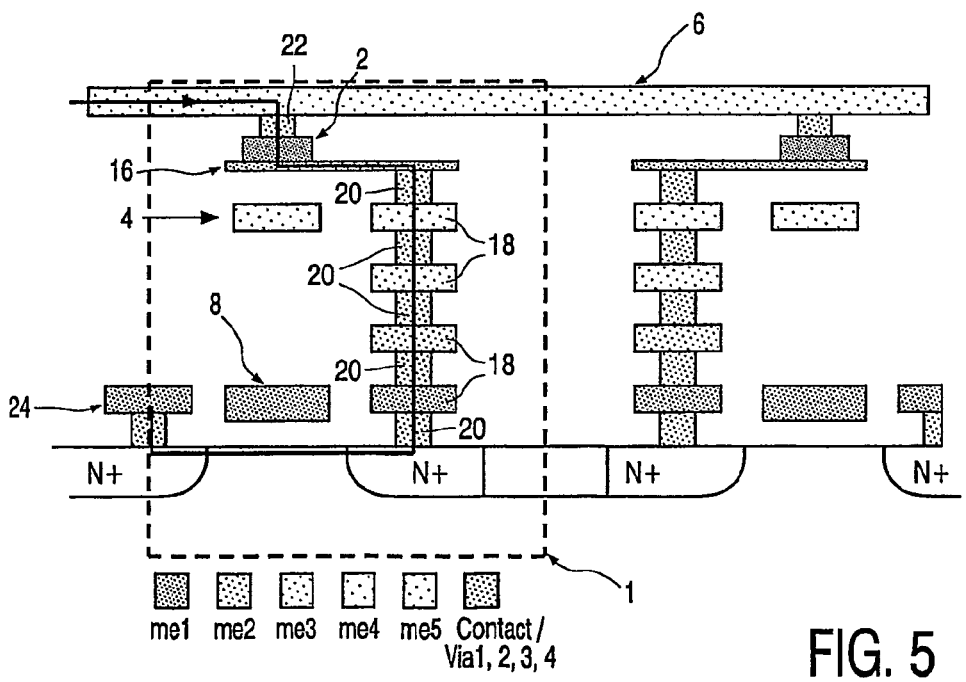
FIG. 5 illustrates the conventional process of reading an MTJ memory cell.
Figure 6:
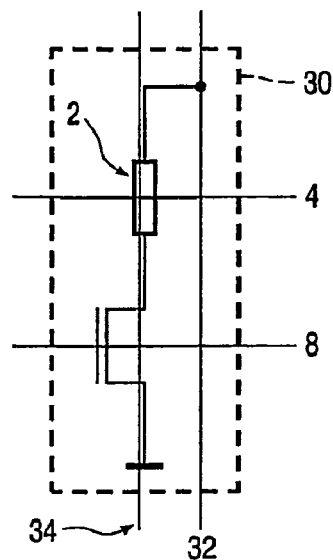
FIG. 6 is an electrical representation of an MTJ cell for use in an embodiment of the present invention.
Figure 7:
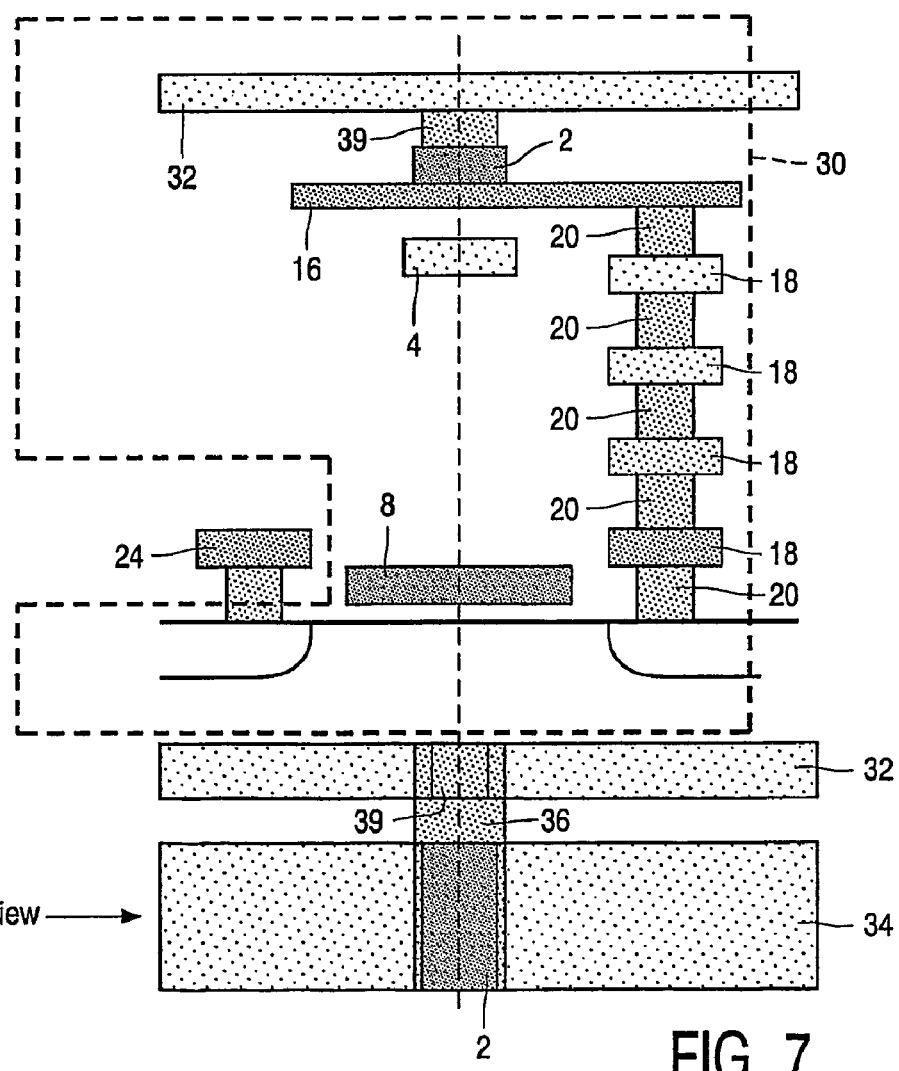
FIG. 7 shows a cross-section and a partly sectioned top view of an MTJ cell as in FIG. 6.

Such a magnetoresistive memory cell 30, which can be used in a matrix according to an embodiment of the present invention, is shown schematically in FIG. 6 and in cross-section and in partly sectioned topview in FIG. 7. As can be seen from these drawings, more particularly from FIG. 6 and from the top view part of FIG. 7, for one magnetoresistive memory cell 30, two bitlines are provided: a read bitline 32 and a write bitline 34. The write bitline 34 is not connected, and thus not electrically couplable, to the MTJ element 2. It is however magnetically coupled to the MTJ element 2 when current is flowing therein. The read bitline 32 is galvanically connected to the MTJ element 2, e.g. by means of a connect layer 36 and a via 39, and is therefore electrically couplable to the MTJ element 2. The two bitlines 32, 34 can only be seen in the top view as they run in parallel. All other elements of the memory cell 30 are as explained above for the prior art memory cell 1.

Figure 8:
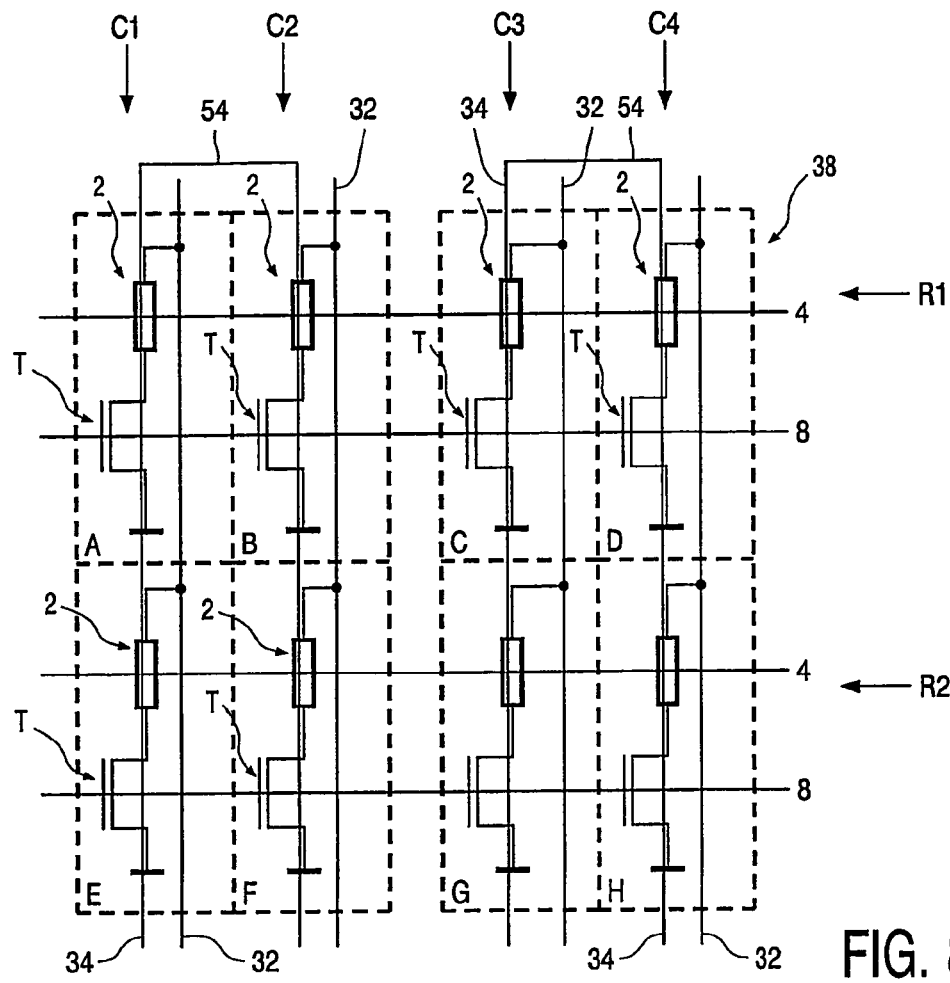
FIG. 8 shows an electrical representation of a 2×2 matrix of magnetoresistive memory cells according to a first embodiment of the present invention, wherein write bitlines of adjacent columns are connected to each other by means of a fixed electrical connection.
Figure 9:
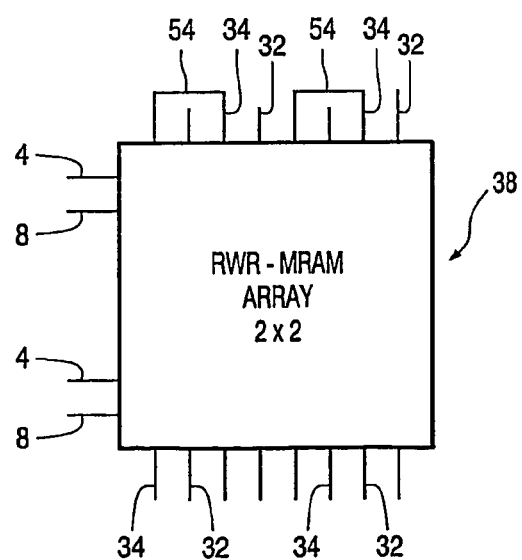
FIG. 9 shows a schematic block diagram of the matrix of FIG. 8.
Figure 10:
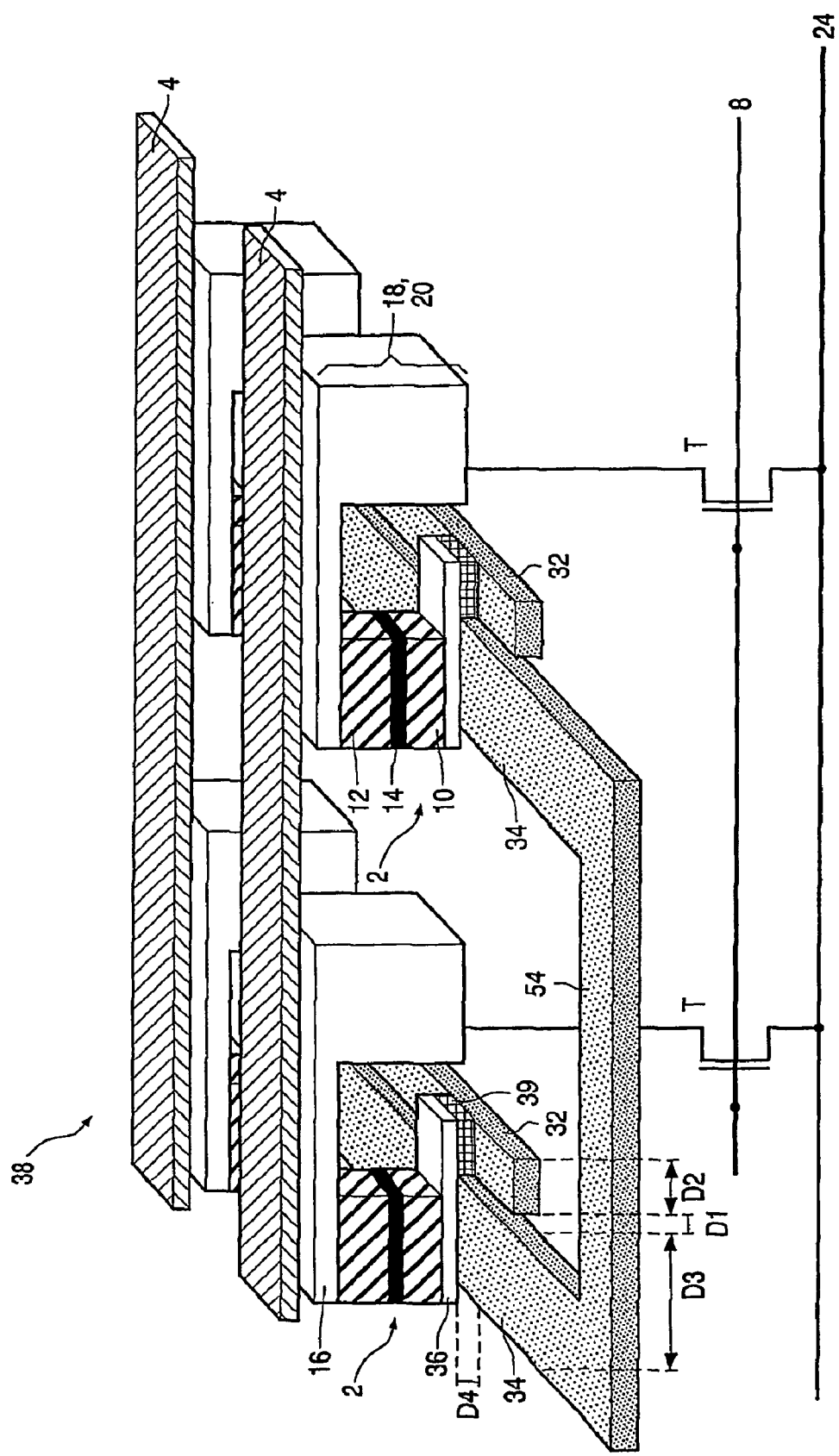
FIG. 10 is a diagrammatic elevational view of a 1×2 matrix according to the first embodiment of the present invention, wherein the magnetoresistive memory elements are MTJ elements.

A matrix 38 of 8 magnetoresistive memory cells 30 (four columns C1, C2, C3, C4 of two magnetoresistive memory elements 2 each), called cells A to H, is shown schematically in FIG. 8, or in a simplified block schematic in FIG. 9. The magnetoresistive cells 2 of the matrix 38 are linked together in parallel columns C1, C2, C3, C4. Each column C1, C2, C3, C4 comprises a plurality of magnetoresistive memory elements 2. Write bitlines 34 lie in a plane over each of the columns C1, C2, C3, C4. Write bitlines 34 of two neighboring columns C1, C2 resp. C3, C4 are connected with each other by connecting means 54. In the embodiment shown in FIG. 8 and FIG. 9, the connecting means 54 is a fixed direct electrical connection between both write bitlines 34. Therefore, write bitline 34 of an odd column C1 resp. C3 has a return path in the same plane, formed by write bitline 34 of an adjacent even column C2 resp. C4. A diagrammatic elevational view of, for example, cells A, B, E and F with the fixed electrical connection 54 between write bitlines 52 of neighboring columns is shown in FIG. 10. It is to be noted that FIG. 8 and FIG. 9 concern a 2×4 array, while FIG. 10 concerns a 2×2 array only. In reality the memory array 38 will generally be a lot larger. It is furthermore to be noted that the structure in FIG. 10 is partially inverted for clarity purposes: digit lines 4 physically run underneath the MTJ elements 2 (at that side of the MTJ elements 2 oriented towards the substrate in which the transistor T is provided), and write bitlines 34 physically run over the MTJ elements 2 (at that side of the MTJ elements 2 oriented away from the substrate in which the transistor T is provided). Read bitlines 32 are physically located adjacent write bitlines 34. However, if drawn that way, the read and write bitlines 32, 34 would obscure the magnetoresistive elements 2.

It can be seen in FIG. 8 and FIG. 10 that bitlines 32, 34 are common for all memory cells 30 in one column C1, C2, C3, C4 of the memory array 38, and that digitlines 4 and wordlines 8 are common for all memory cells 30 in a row R1, R2 of the memory array 38. A wordline 8 is connected to a switching element T in each cell, e.g. to a transistor switching element. The write bitlines 34 of two adjacent columns C1, C2, resp. C3, C4 are connected with each other by means of a fixed electrical connection 54.

Current flowing through write bitline 34 of column C1 in one direction, flows through write bitline 34 of column C2 (the return path) in the opposite direction. When programming a memory element 2 from for example column C1, the associated memory element 2 from column C2, i.e. the memory element 2 on the same row but under the return path of the write bitline 34 of column C1, will be programmed with the inverse value, as explained later.

The space D1 between the read bitlines 32 and the corresponding write bitlines 34 is preferably the minimum metal pitch of the manufacturing process in which the MRAM cells 30 are made, e.g. typically limited by lithography. The width D2 of the read bitlines 32 is preferably the minimum metal width of the manufacturing process in which the MRAM cells 30 are made, e.g. typically limited by lithography. It may be somewhat larger than the minimum width, however. The width D3 of the write bitlines 34 is preferably at least that width that substantially covers the MTJ element 2.

The distance D4 between the MTJ element 2 and the write bitline 34 is somewhat larger than in a conventional MRAM cell 1. It should, however, preferably be kept as small as possible. As an example, the distance D4 can be equal or less than a regular oxide thickness between two subsequent metallization layers.

Figure 11:
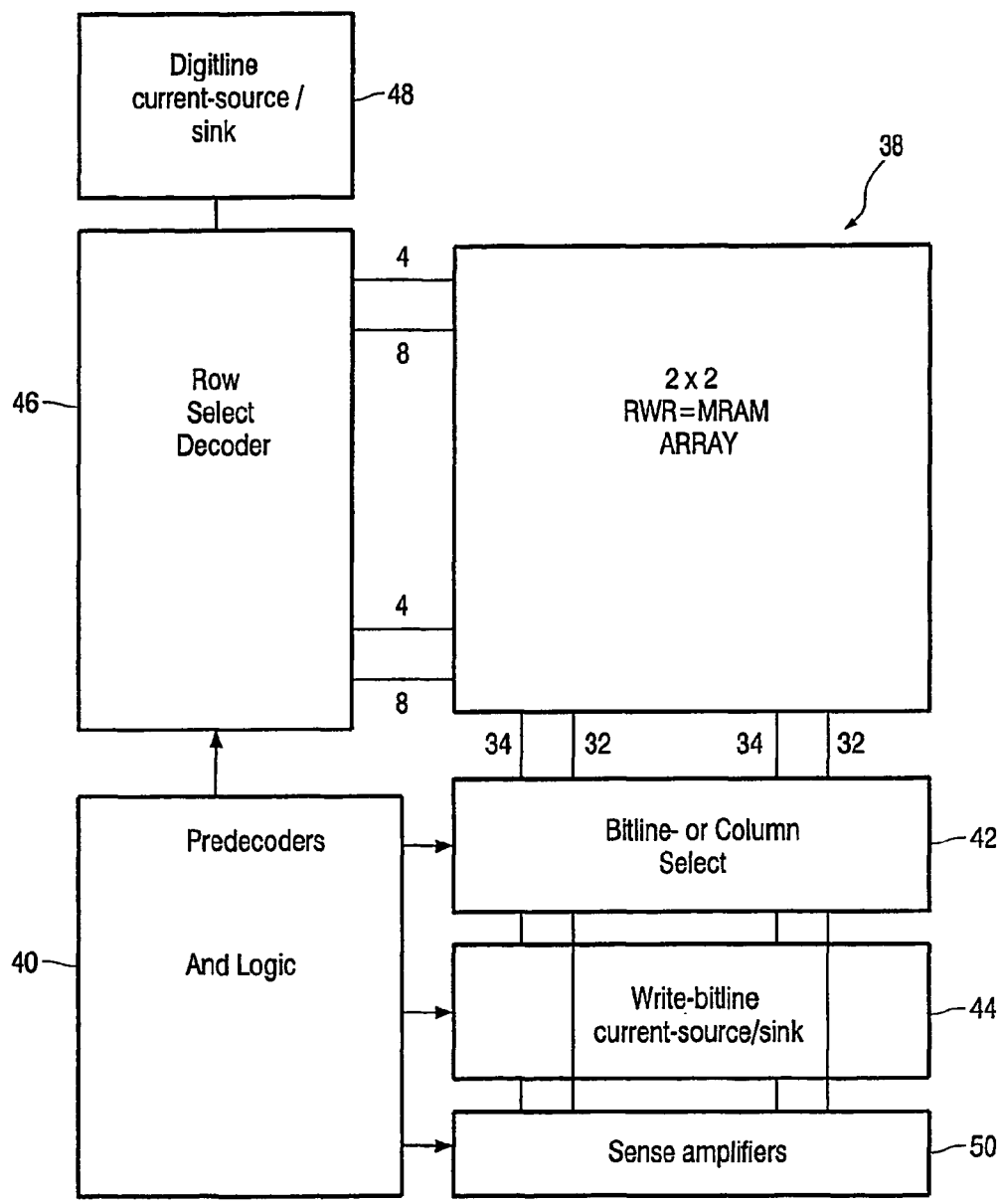
FIG. 11 shows a simplified block schematic of an MRAM memory according to an embodiment of the present invention.

When in the memory array 38, for example a cell A (see FIG. 8) needs to be written, the operation is as follows (with reference to FIG. 11):

Blocks 40, 42, 44, 46, 48 form together selecting circuitry. Through a "predecoders and logic" block 40, cell A is selected for write. This means that the appropriate write bitline 34 of column C1 is connected through a "bitline or column select" block 42 to a "write bitline current source" 44. The "precoders and logic" block 40 together with a "row select decoder" 46 selects cell A also for write, which means that the appropriate digitline 4 of row R1 is connected with a "digitline current source" 48. The wordline 8 of the cell to be written in (i.e. wordline 8 of row R1) is set to a value to turn off the associated switching elements T1, T2, e.g. in case of transistors, for instance, zero volt. In this way, current flows through both the write bitline 34 (of column C1) and the digitline 4 (of row R1) of the selected cell. As write bitline 34 of column C1 is electrically connected to write bitline 34 of column C2, the same current also flows through write bitline 34 of column C2. The currents through the write bitlines 34 of columns C1 and C2 and through the digitline 4 of row R1 together provide a magnetic field able to change the direction of the magnetic vector of the free layers 12 of the memory elements 2 of cells A and B, while the current in either strip by itself is not able to change the storage state. As the current through write bitline 34 of column C2 flows in a direction opposite to the current through write bitline 34 of column C1, and the current through digitline 4 of row R1 flows for both memory elements 2 of cells A and B in the same direction, the magnetization direction of the free layer of both memory elements 2 of cells A and B will be opposite. The current levels in write bitlines 34 of columns C1 and C2 and in digitline 4 of row R1 are designed to be much smaller than the field required to rotate the magnetization of the pinned layer 10. The resistance of the MTJ cells 2 of cells A and B is brought in this way to a LoRes or HiRes state (depending on the direction of the current through the bitlines 34 of columns C1 and C2, which is dependent on the content to be stored in the memory cell A). The MTJ cells 2 of cells A and B are oppositely switched due to the opposite directions of the current in the write bitlines 34: one MTJ cell is in the LoRes state while the other is in the HiRes state or vice versa. The relative resistance change between HiRes and LoRes depends on the voltage applied to the write bitlines 34: it is about 25% at a bitline voltage of 0.6V, about 35% at a bitline voltage of 0.3V and about 45% at a bitline voltage of 0.1V.

The array with magnetoresistive memory elements according to the present invention gives a maximum readout signal due to the fact that it comprises two magnetoresistive elements that are always oppositely switched. This is advantageous for high-speed sensing of the MRAM bits. Furthermore, the connection of the write-bitlines results in a small loop, which is gives good EMC behavior (due to a small loop of high-current bitlines).

The created magnetic field H is related to the write current I as follows: $H = I/6.28 R$, where H is the magnetic field at a radius R from the center of the field. The center of the field is the metal wire in which the current I flows.

The write current through the write bitlines 34 is between 0.5 mA and 5 mA. The write current in the MRAM cell 30 according to the present invention needs to be somewhat higher than in prior art devices, because the distance between write bitlines 34 and the magnetic layers of the memory element 2 is slightly larger than when the prior art write bitline 6 was attached to the memory element 2. The write current to be used depends on the size of the memory element 2 and on the technology used.

When in the memory array 38, for example a cell A (see FIG. 8) needs to be read, the operation is as follows (with reference to FIG. 11):

Cell A (FIG. 8) is selected for read. This means that the "bitline or column select" block 42 connects the read bitline 32 of cell A with "sense amplifiers" 50. Also the read bitline 32 of cell B is connected with sense amplifiers 50. The "row select decoder" 46 applies to the wordline 8 of the row R1 on which cell A is located, a voltage suitable to turn the associated switching elements T1, T2 in the on-state. For example in case of transistors as switching elements, the applied voltage can be Vdd. At that moment, the read bitline 32 of column C1 is electrically coupled to the MTJ element 2 of cell A, and the read bitline 32 of column C2 is electrically coupled to the MTJ element 2 of column C2. The state of the memory cell A is determined by measuring the resistance of memory element 2 of cell A when a sense current much smaller than the write currents (typically in the μA range), is passed perpendicularly through the memory element 2 of cell A, and by comparing this with the resistance of associated memory element 2 of cell B. It is known that, due to the way of writing the information into the memory cells, if memory element 2 of cell A is in the LoRes state, memory element 2 of cell B is in the HiRes state and vice versa.

By a device according to embodiments of the present invention, the read and the "reference" MTJ preferably always have the opposite resistive state. In this way, there is always a clear difference in sense or read current, which makes sensing of data faster.

The magnetic fields of the sense or read currents is negligible and does not affect the magnetic states of the memory elements. The probability of tunneling of charge carriers across the tunnel barrier layer 14 depends on the relative alignment of the magnetic moments of the free layer 12 and the pinned layer 10. The tunneling probability of the charge carriers is highest, and thus the resistance lowest, when the magnetic moments of both layers are aligned. The tunneling probability of the charge carriers is lowest, and thus the resistance highest, when the magnetic moments are anti-aligned. As a result, the two possible magnetization directions of the free layer uniquely define two possible bit states (0 or 1) for the memory cell.

When a write operation is ongoing, a high current (mA range) in the write bitline 34 of column C1 (and thus also in write bitline 34 of column C2) will induce a magnetic field. Through the read bitlines 32, which are parallel to the write bitlines 34, a small current will flow in the μA range, which is basically the current through the read MTJ element 2 and the switching element T, e.g. the selecting transistor of the MRAM cell. This small current will cause only a small magnetic field, which does not influence the storage state of the MTJ element 2. It is noted that this small magnetic field in the read bitlines 32 is in distance farther away from the MTJ elements 2 than the write bitlines 34, which reduces the effect of the small magnetic field on the MTJ elements 2 even further.

With the embodiment of the present invention as described above, simultaneous read and write can be carried out. When in the memory array 38, for example a cell A (see FIG. 8) needs to be written and cell E needs to be read, the operation is as follows (with reference to FIG. 11):

Through the "predecoders and logic" block 40, cell A is selected for write. This means that the appropriate write bitline 34 is connected through the "bitline or column select" block 42 to the "write bitline current source" 44. The "predecoders and logic" block 40 together with the "row select decoder" 46 selects cell A also for write, which means that the appropriate digitline 4 is connected with the "digitline current source" 48. The wordline 8 of the cell A to be written in is set to a value to turn off the associated switching elements T1, T2, e.g. in case of transistors, for instance, zero volt. In this way, current flows through both the write bitline 34 of column C1 and write bitline 34 of column C2, and through the digitline 4 of row R1 of the selected cell A. Those currents together provide a magnetic field able to change the direction of the magnetic vector of the free layer 12 of the memory element 2 in the selected cell on row R1 and column C1, and its associated memory element 2 in the adjacent cell on row R1 and column C2, while the current in either strip by itself is not able to change the storage state. As the current through write bitline 34 of column C2 flows in a direction opposite to the current through write bitline 34 of column C1, and the current through digitline 4 flows for both memory elements 2 in the same direction, the magnetization direction of the free layer of both memory elements 2 of cells A and B will be opposite. The current levels are designed to be much smaller than the field required for rotating the magnetization of the pinned layer 10. The resistance of the memory element 2 of cell A is brought in this way to a LoRes or HiRes (depending on the direction of the current through the bitline 34, which is dependent on the content to be stored in the memory cell A). The MTJ memory elements 2 of memory cells A and B are oppositely switched due to the opposite directions of the current in the write bitlines 34: one MTJ cell is in the LoRes state while the other is in the HiRes state or vice versa.

At the same moment of writing to cell A, cell E (FIG. 8) is selected for read. This means that the "bitline or column select" block 42 connects the read bitlines 32 of column C1 (which happens to be also the read bitline 32 of cell A in the example given) and of column C2 with the "sense amplifiers" 50. The "row select decoder" 46 applies to the wordline 8 of the row R2 on which cell E is located, a voltage suitable to turn the switching elements T on row R2 in the on-state. For example in case of transistors as switching elements T, the applied voltage can be Vdd. At that moment, the read bitline 32 of column C1 is electrically coupled to the MTJ element 2 of cell E and the read bitline 32 of column C2 is electrically coupled to the MTJ element 2 of cell F. The state of the memory cell is determined by measuring the resistances of memory elements 2 of cells E and F when a sense current much smaller than the write currents (typically in the μA range), is passed perpendicularly through these memory elements 2. The magnetic field of this sense or read current is negligible and does not affect the magnetic state of the memory cell. The two resistances are compared, and the memory state of the cell E is determined depending on whether memory element 2 of cell E is in the HiRes state and memory element 2 of cell F in the low resolution state, or vice versa.

Cell A can thus be written, and cell E can be read at the same time, cell A and cell E being two cells on the same column of the array. Or, in other words, the matrix or array 38 described can be used in a read-while-write operation.

If cell A has to be written, and cell C has to be read, the write bitline 34 of cell A (and also write bitline 34 of cell B, as this is the return path of write bitline 34 of cell A) and the digitline 4 of cell A are connected to their respective current sources 44, 48. Furthermore, the read bitlines 32 of cells A and B are disabled by disconnecting them from the sense amplifiers 50. For cell C, the write bitlines 34 of columns C3 and C4 are disabled of course, but the read bitlines 32 of cells C and D are connected to the sense amplifiers 50. Also the word line 8 of row R1 is put on a voltage suitable to switch on the switching elements T of cells C and D, e.g. selecting transistors (automatically the switching element T for cell A is also switched on, but this does not have consequences).

Now cell A can be written and cell C can be read at the same time, cell A and cell C being two cells on the same row R1 of the array 38.

The speed of operation of the MRAM memory array 38 can be more than doubled with regard to the speed of a prior art MRAM memories with one bitline in this way, because write and read operations on different cells can now be done simultaneously. For example, in 0.6 μm technology, a write or read speed of 18 ns can be reached. In future more advanced technologies, still higher read and write speeds will be possible. Furthermore, speed of operation is enhanced as a maximum read-out signal is always obtained.

As for the prior art devices, an MRAM memory according to the described embodiment of the present invention can also be used for separate read and write operations by only selecting one memory cell at a time. Read and write operations can also be carried out at the same moment on different cells when they are located on different rows and columns.

Figure 12:
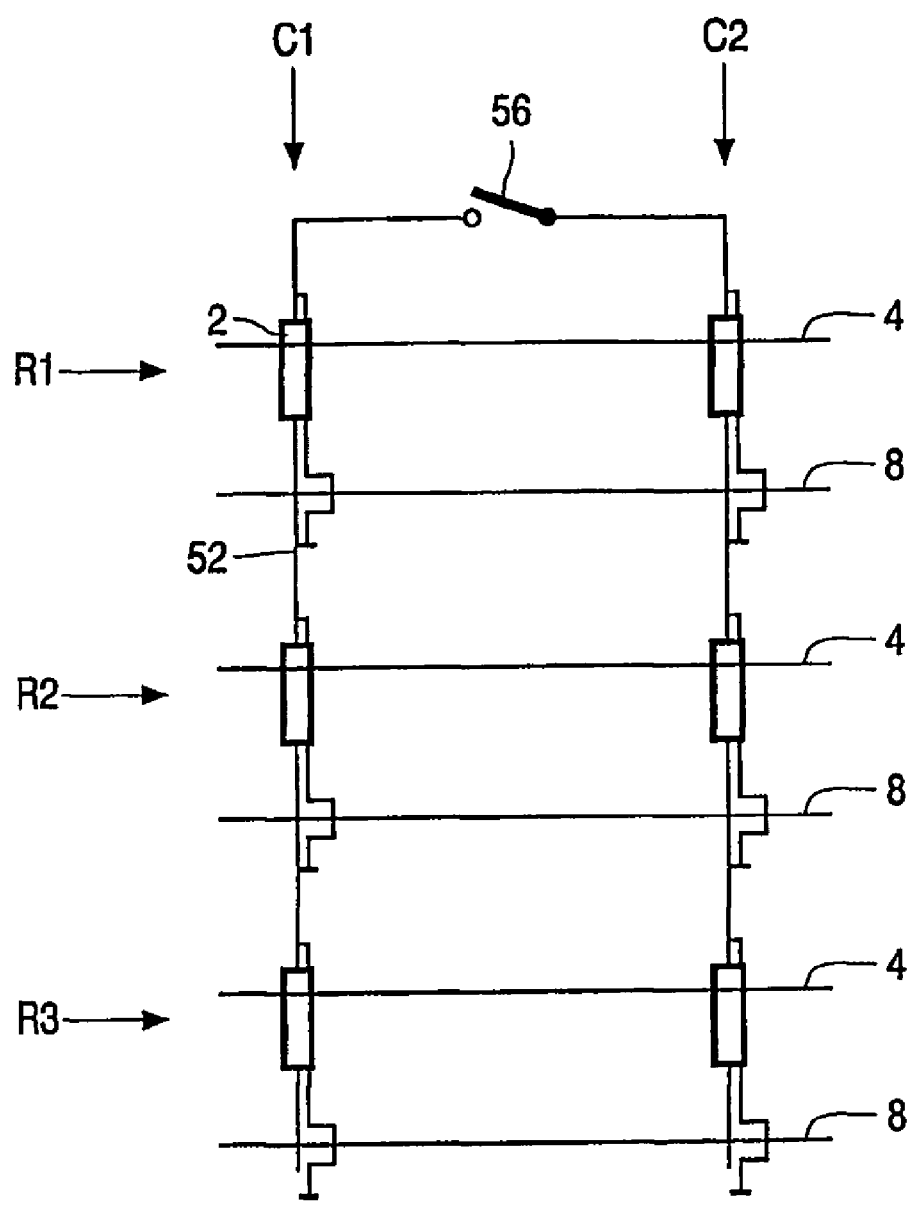
FIG. 12 is a schematic illustration of a memory array according to a further embodiment of the present invention, wherein bitlines of adjacent columns are temporarily connectable to each other by means of a switch.

According to a second embodiment of the present invention, an array of conventional memory cells linked together in logical rows and columns is provided, as schematically represented in FIG. 12. Each memory cell comprises a magnetoresistive memory element 2. Each column C1, C2 of the array has a bitline 52 for reading and writing data from or into the memory elements 2, and each row R1, R2, R3 of the array has a wordline 8 and a digitline 4. The bitlines 52 of two adjacent columns C1, C2 are connected with each other by means of connecting means, which in this embodiment is a switching element 56. This switch 56 is closed for writing data into the memory cells 2, thus forming a return path for the writing current. Therefore, data written in two associated memory cells 2 (i.e. memory cells on the same row, but in two adjacent columns which can be connected to each other by means of connecting means) is the inverse from each other, i.e. one memory element 2 is brought in the HiRes state while the other is brought in the LoRes state, and vice versa. Furthermore, when closing the switch 56, a return path for the high writing current is provided, which reduces EMI problems. For reading out the memory cells 2, the switch 56 is opened. That way, the content of two associated memory elements 2 in columns C1 and C2 can be read simultaneously. By the way of writing or programming the memory elements 2 itself (two associated memory cells 2 having an inverse state), when comparing the read currents through the associated memory cells, a maximum read-out signal is always obtained, which enables a fast read-out.

A disadvantage of this second embodiment over the first embodiment is that the switch 56 must be large enough to be able to switch the programming or writing current without too much voltage drop.

It is to be understood that although specific constructions and configurations, as well as materials, have been discussed herein for devices according to the present invention, deviations can be made therein without departing from the spirit and scope of the present invention. For example, instead of a transistor T being connected to each magnetoresistive memory element, one transistor may be connected to two memory elements which are adjacent to each other in adjacent columns and which can be written simultaneously. Each of these memory elements is coupled to a different column read line therefore they can be read out individually even though their other electrodes are both connected to a ground line via the single transistor T.

The invention claimed is:

1. An MRAM memory compising a matrix and selecting circuitry for selecting at least a cell to be read or a cell to be written, the matrix having magnetoresistive memory cells, each magnetoresistive memory cell comprising:
   a magnetoresistive memory element, the magnetoresistive memory cells being linked together to form logically organized rows and columns, there being at least a first row or column adjacent to a second row or column, the first row or column having at least a first row or column write line and the second row or column having at least a second row or column write line,
   wherein the matrix comprises connecting means between said first and second row or column write lines, for at least temporarily electrically connecting said first and second row or column write lines to each other, so that a current flowing in the first row or column write line flows in the opposite direction to the same current flowing in the second row or column write line; and
   wherein each row or column has a wordline and each magnetoresistive memory cell comprises a second switching element for connecting another electrode of the magnetoresistive memory element to a voltage source, the wordline being a continuous strip electrically connected to each of the second switching elements of a row or column.

2. An MRAM memory according to claim 1, wherein each of the first and second adjacent rows or columns has a row or column read line.

3. An MRAM memory according to claim 2, wherein the row or column read lines and the row or column write lines for a same row or column, respectively, are separate lines.

4. An MRAM memory matrix according to claim 2, wherein the row or column read lines and the row or column write lines for a same row or column, respectively, are physically the same lines.

5. An MRAM memory according to claim 2, wherein the column or row read lines are continuous conductive strips which are electrically couplable to an electrode of the magnetoresistive memory elements of the magnetoresistive memory cells of a column or row, respectively.

6. An MRAM memory according to claim 2, furthermore comprising sense amplifiers connectable to the column read lines.

7. An MRAM memory according to claim 1, wherein the connecting means comprises a fixed electrical connection between the first and second row or column write lines.

8. An MRAM memory according to claim 1, wherein the connecting means comprises a first switching element.

9. An MBAM memory according to claim 1, wherein the first and second column or row write lines are continuous conductive strips which are magnetically couplable to the magnetoresistive elements of each of the memory cells of the respective column or row.

10. An MRAM memory according to claim 1, wherein each row or column has a digitline, the digitline being a continuous conductive strip which is magnetically couplable to the magnetoresistive memory element of each of the magnetoresistive memory cells of a row or column.

11. An MRAM memory according to claim 1, wherein the selecting circuitry comprises at least a row select decoder or a column select decoder.

12. An MRAM memory according to claim 11, wherein a row current source is connected to the row select decoder for providing a selected digtline with electrical energy.

13. An MRAM memory according to claim 11, wherein a write bitline current source is connected to the column select decoder for providing a selected write line with electrical energy.

14. An MRAM memory according to claim 1, wherein the selecting circuitry is adapted to provide simultaneous reading of one cell in a column and writing to another cell in the same column or simultaneous reading from one cell in a row and writing to another cell in the same row.

15. A method of operation a matrix with magnetoresistive memory cells having a first and second state and linked together to form logical columns sad rows, comprising the steps of:
   simultaneously writing a first state into memory cell of a first row or column;
   writing a second state into an adjacent memory cell of an adjacent row or column; and
   simultaneously reading from one cell in a column and writing to another cell in the same column or simultaneously reading from one cell in a row and writing of another cell in the same row.

16. The method as recited in claim 15, wherein each state relates to a resistance value of a magnetoresistive memory cell, the method further comprising,
   a step of simultaneously reading out two adjacent memory cells of two adjacent rows or columns for obtaining resistance values of two adjacent memory cells, and
   comparing said resistance values for obtaining memory content.

17. The method as recited in claim 15, further comprising a step of reducing electromagnetic interference by sending current through a column or row write line and through a return path lying in the same plane as the column or row write line and adjacent to the column or row write line.

18. A method of making an MRAM memory, comprising:
   forming a plurality of magnetoresistive memory elements logically arranged in rows and columns,
   forming at least a first and a second row or column write line to be magnetically couplable to the magnetoresistive memory elements of first and second adjacent rows or columns, respectively, and
   forming connecting means between said first and second row or column write lines for at least temporarily electrically connecting said first and second row or column write lines to each other,
   wherein the step of forming the connecting means comprises forming a fixed electrical connection.

19. The method as recited in claim 18, wherein the step of forming the connecting means comprises forming a switch element.

* * * * *